(12) United States Patent
Vijayakumar et al.

(10) Patent No.: US 12,520,415 B2
(45) Date of Patent: *Jan. 6, 2026

(54) METHOD OF TRANSFERRING HEAT FROM UNGROUNDED ELECTRONIC COMPONENTS

(71) Applicant: SKYWORKS SOLUTIONS, INC., Irvine, CA (US)

(72) Inventors: Bhuvaneshwaran Vijayakumar, Irvine, CA (US); Robert Francis Darveaux, Corona Del Mar, CA (US); Lori Ann DeOrio, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 297 days.

This patent is subject to a terminal disclaimer.

(21) Appl. No.: 18/111,950

(22) Filed: Feb. 21, 2023

(65) Prior Publication Data

US 2023/0269861 A1    Aug. 24, 2023

Related U.S. Application Data

(60) Provisional application No. 63/312,882, filed on Feb. 23, 2022, provisional application No. 63/312,881, filed on Feb. 23, 2022.

(51) Int. Cl.
*H05K 1/02* (2006.01)
*H01L 23/00* (2006.01)
(Continued)

(52) U.S. Cl.
CPC ....... *H05K 1/0204* (2013.01); *H01L 23/3735* (2013.01); *H01L 23/49827* (2013.01);
(Continued)

(58) Field of Classification Search
CPC ..... H05K 1/0201–0212; H05K 1/0215; H05K 1/0298; H05K 7/2039; H01L 23/367;
(Continued)

(56) References Cited

U.S. PATENT DOCUMENTS 9,837,592 B2    12/2017  Ho et al.
11,832,387 B2 *  11/2023  Kim ................. H05K 1/0209
(Continued)

OTHER PUBLICATIONS

International Search Report and Written Opinion from corresponding International Application No. PCT/US2023/013489 dated Jun. 13, 2023.

*Primary Examiner* — Amir A Jalali
(74) *Attorney, Agent, or Firm* — Lando & Anastasi, LLP

(57) ABSTRACT

A method for manufacturing an electronic package comprises providing at least one electronic component, the at least one electronic component including at least one non-groundable thermal output, providing a substrate in which a ground plane is enclosed in or supported by the substrate, defining at least one thermally conductive pathway extending between an interface exposed on the substrate and the ground plane such that the interface is electrically isolated from the ground plane, and mounting the electronic component to the substrate, the mounting including thermally coupling the output to the interface with at least one thermally conductive member.

19 Claims, 6 Drawing Sheets

(51) Int. Cl.
*H01L 23/373* (2006.01)
*H01L 23/498* (2006.01)

(52) U.S. Cl.
CPC .............. *H01L 24/13* (2013.01); *H01L 24/16* (2013.01); *H05K 1/0215* (2013.01); *H01L 24/14* (2013.01); *H01L 24/29* (2013.01); *H01L 24/73* (2013.01); *H01L 2224/13147* (2013.01); *H01L 2224/1403* (2013.01); *H01L 2224/16227* (2013.01); *H01L 2224/2919* (2013.01); *H01L 2224/73204* (2013.01); *H01L 2924/0665* (2013.01)

(58) Field of Classification Search
CPC ........... H01L 23/3735; H01L 23/49827; H01L 23/5383; H01L 23/5226; H01L 24/13; H01L 24/14; H01L 24/16; H01L 24/18; H01L 24/29; H01L 24/73; H01L 2224/13147; H01L 2224/1403; H01L 2224/17227; H01L 2224/2919; H01L 2224/33519; H01L 2224/73204; H01L 2934/0665; B23K 1/008; B23K 2101/36
See application file for complete search history.

(56) References Cited

U.S. PATENT DOCUMENTS

| | | | |
|---|---|---|---|
| 2004/0125578 A1* | 7/2004 | Konishi | H01L 24/97 257/E23.125 |
| 2005/0023558 A1* | 2/2005 | Shi | H01L 23/3121 257/E23.125 |
| 2006/0284304 A1* | 12/2006 | Caletka | H01L 24/83 257/E23.105 |
| 2007/0040255 A1 | 2/2007 | Osone et al. | |
| 2007/0258173 A1* | 11/2007 | Chen | G11C 5/04 361/42 |
| 2015/0243580 A1 | 8/2015 | Joshi | |
| 2015/0319841 A1 | 11/2015 | Kobayashi | |
| 2016/0227603 A1 | 8/2016 | Huang et al. | |
| 2016/0233178 A1* | 8/2016 | Lamy | H01Q 15/008 |
| 2016/0351466 A1 | 12/2016 | Perkins | |
| 2017/0005693 A1 | 1/2017 | Puente et al. | |
| 2020/0212020 A1* | 7/2020 | Zhang | H01L 23/528 |
| 2023/0268247 A1 | 8/2023 | Vijayakumar et al. | |

* cited by examiner

METHOD OF TRANSFERRING HEAT FROM UNGROUNDABLE ELECTRONIC COMPONENTS

CROSS-REFERENCE TO RELATED APPLICATIONS

This application claims priority under 35 U.S.C. § 119(e) to U.S. Provisional Patent Application Ser. No. 63/312,882, titled "HEAT TRANSFER FROM NON-GROUNDABLE ELECTRONIC COMPONENTS," filed Feb. 23, 2022 and to U.S. Provisional Patent Application Ser. No. 63/312,881, titled "HEAT TRANSFER FROM NON-GROUNDABLE ELECTRONIC COMPONENTS," filed Feb. 23, 2022, the content of each being incorporated herein in its entirety by reference for all purposes.

BACKGROUND

Field

The present disclosure relates to an electronic package having an electronic component with a non-groundable thermal output. The present disclosure also relates to an electronic device incorporating such an electronic package. The present disclosure also relates to a method of manufacturing such an electronic package.

Description of the Related Technology

Electronic components having a non-groundable thermal output are known in which operation of the electronic component is dependent on there not being an electrically conductive pathway from the output to ground. A cascode amplifier is an example of such an electronic component, having an emitter which heats up during use. Operation of the cascode amplifier is dependent on the emitter not being short circuited to ground. The cascode amplifier may be mounted to a substrate panel to define an electronic package, with a mold structure formed of an insulative material filling the space between the emitter of the cascode amplifier and the substrate panel.

SUMMARY

According to one aspect there is provided an electronic package. The electronic package comprises a substrate, at least one ground plane enclosed in or supported by the substrate, at least one electronic component mounted to the substrate, the at least one electronic component comprising at least one non-groundable thermal output, at least one thermally conductive pathway extending within the substrate between an interface exposed on the substrate and the ground plane, the thermally conductive pathway configured to electrically isolate the interface from the ground plane, and at least one thermally conductive member coupling the output to the interface.

In one example the thermally conductive member comprises a pillar extending between opposed first and second ends, the first end coupled to the output and the second end coupled to the interface. In one example the pillar has a substantially uniform cross-section extending from the first end to the second end.

In one example the thermally conductive member is substantially spherical or oval in shape.

In one example the electronic package comprises a plurality of the thermally conductive members coupling the output to the interface.

In one example the thermally conductive member is formed of one of copper or solder.

In one example the interface is configured for soldering thereto.

In one example the interface comprises a metallic pad. In one example the metallic pad is formed of copper.

In one example the thermally conductive member comprises a solder ball defining a soldered connection between the output and the interface.

In one example a first end of the thermally conductive member is soldered to the electronic component and a second end of the thermally conductive member is soldered to the interface.

In one example a first end of the thermally conductive member is soldered to the electronic component and a second end of the thermally conductive member is in non-bonded surface contact with the interface.

In one example a first end of the thermally conductive member is in non-bonded surface contact with the output and a second end of the thermally conductive member is soldered to the interface.

In one example the thermally conductive pathway comprises or consists of any of aluminum nitride, silicon carbide, or diamond.

In one example the thermally conductive pathway comprises or consists of an electrically insulative material having a thermal conductivity at room temperature within 35%, or within 30%, or within 25%, or within 20%, or within 15%, or within 10%, or within 5% of the thermal conductivity of copper at room temperature.

In one example the thermally conductive pathway comprises at least one portion of thermally conductive, electrically insulative material.

In one example the thermally conductive pathway further comprises one or more electrically conductive portions, in which the portion of thermally conductive, electrically insulative material is coupled to the one or more electrically conductive portions such that the interface is electrically isolated from the ground plane.

In one example the portion of thermally conductive, electrically insulative material comprises or consists of any of aluminum nitride, silicon carbide, or diamond.

In one example the portion of thermally conductive, electrically insulative material has a thermal conductivity at room temperature within 35%, or within 30%, or within 25%, or within 20%, or within 15%, or within 10%, or within 5% of the thermal conductivity of copper at room temperature.

In one example the one or more electrically conductive portions are formed of copper.

In one example the one or more electrically conductive portions comprise one or more electrically conductive tracks coupled to one or more vias.

In one example the portion of thermally conductive, electrically insulative material is encapsulated within the substrate.

In one example the portion of thermally conductive, electrically insulative material is positioned against the ground plane.

In one example an exposed region of the portion of thermally conductive, electrically insulative material defines the interface.

In one example a metallic layer is defined on an exposed region of the portion of thermally conductive, electrically insulative material, the metallic layer defining the interface. In one example the metallic layer is configured for soldering thereto.

In one example the at least one non-groundable thermal output comprises first and second non-groundable thermal outputs.

In one example the at least one electronic component comprises first and second electronic components, the first electronic component including the first non-groundable thermal output and the second electronic component including the second non-groundable thermal output.

In one example the at least one thermally conductive pathway comprises first and second thermally conductive pathways, the first thermally conductive pathway extending between a first interface exposed on the substrate and the ground plane, the second thermally conductive pathway extending between a second interface exposed on the substrate and the ground plane.

In one example the first thermally conductive pathway is configured to electrically isolate the first interface from the ground plane, and the second thermally conductive pathway is configured to electrically isolate the second interface from the ground plane.

In one example the at least one thermally conductive member comprises a first thermally conductive member and a second thermally conductive member, the first thermally conductive member coupling the first output to the first interface, and the second thermally conductive member coupling the second output to the second interface.

In one example the first and second thermally conductive pathways comprise or consist of any of aluminum nitride, silicon carbide, or diamond.

In one example the first and second thermally conductive pathways comprise or consist of an electrically insulative material having a thermal conductivity at room temperature within 35%, or within 30%, or within 25%, or within 20%, or within 15%, or within 10%, or within 5% of the thermal conductivity of copper at room temperature.

In one example the first and second thermally conductive pathways comprise respective first and second portions of thermally conductive, electrically insulative material, the first and second portions spatially distinct from each other.

In one example the first and second portions of thermally conductive, electrically insulative material comprise or consist of any of aluminum nitride, silicon carbide, or diamond.

In one example the first and second portions comprise or consist of an electrically insulative material having a thermal conductivity at room temperature within 35%, or within 30%, or within 25%, or within 20%, or within 15%, or within 10%, or within 5% of the thermal conductivity of copper at room temperature.

In one example the first and second thermally conductive pathways comprise a shared portion of thermally conductive, electrically insulative material coupling the first and second thermally conductive pathways to each other.

In one example the shared portion of thermally conductive, electrically insulative material comprises or consists of any of aluminum nitride, silicon carbide, or diamond.

In one example the shared portion comprises or consists of an electrically insulative material having a thermal conductivity at room temperature within 35%, or within 30%, or within 25%, or within 20%, or within 15%, or within 10%, or within 5% of the thermal conductivity of copper at room temperature.

In one example either or both of the first and second thermally conductive members comprises a pillar extending between opposed first and second ends, the first end coupled to the respective first or second output and the second end coupled to the respective first or second interface. In one example the pillar has a uniform cross-section extending from the first end to the second end.

In one example either or both of the first and second thermally conductive members is substantially spherical or oval in shape.

In one example a plurality of the first thermally conductive members couple the first output to the first interface.

In one example a plurality of the second thermally conductive members couple the second output to the second interface.

In one example either or both of the first and second thermally conductive members is formed of copper or solder.

In one example the electronic component comprises a cascode power amplifier.

In one example the electronic component is integrated into a die, the die mounted to the substrate.

In one example the die is mounted to the substrate by surface-mount technology (SMT).

In one example, the die is mounted to the substrate by solder balls or wire bonds.

In one example the electronic component is a surface-mount technology (SMT) component. In one example the electronic component is directly mounted to the substrate by SMT. In one example the electronic component is directly mounted to the substrate by solder balls or wire bonds.

According to another aspect there is provided an electronic device. The electronic device comprises a circuit board configured to receive one or more electronic packages, and an electronic package mounted to the circuit board. The electronic package includes a substrate, at least one ground plane enclosed in or supported by the substrate, at least one electronic component mounted to the substrate, the at least one electronic component including at least one non-groundable thermal output, at least one thermally conductive pathway extending within the substrate between an interface exposed on the substrate and the ground plane, the thermally conductive pathway configured to electrically isolate the interface from the ground plane, and at least one thermally conductive member coupling the output to the interface.

In one example the electronic device is a wireless mobile device.

According to another aspect there is provided a method for manufacturing an electronic package. The method comprises providing at least one electronic component, the at least one electronic component comprising at least one non-groundable thermal output, providing a substrate in which a ground plane is enclosed in or supported by the substrate, defining at least one thermally conductive pathway extending between an interface exposed on the substrate and the ground plane such that the interface is electrically isolated from the ground plane, and mounting the electronic component to the substrate, the mounting comprising thermally coupling the output to the interface with at least one thermally conductive member.

In one example the thermally conductive member comprises a pillar extending between opposed first and second ends, and the step of mounting the electronic component to the substrate comprising coupling the first end of the pillar to the output and coupling the second end of the pillar to the interface. In one example the pillar has a substantially uniform cross-section extending from the first end to the second end.

In one example the thermally conductive member is substantially spherical or oval in shape.

In one example the mounting step comprises thermally coupling the output to the interface with a plurality of the thermally conductive members.

In one example the thermally conductive member is formed of copper or solder.

In one example the interface is configured for soldering thereto.

In one example thermally coupling the output to the interface comprises soldering the thermally conductive member to the interface.

In one example the interface comprises a metallic pad. In one example the metallic pad is formed of copper.

In one example the thermally conductive member comprises a solder ball, and thermally coupling the output to the interface comprises heating the solder ball to define a soldered connection between the output and the interface.

In one example thermally coupling the output to the interface comprises soldering a first end of the thermally conductive member to the electronic component and soldering a second end of the thermally conductive member to the interface.

In one example thermally coupling the output to the interface comprises soldering a first end of the thermally conductive member to the electronic component and disposing a second end of the thermally conductive member to be in non-bonded surface contact with the interface.

In one example thermally coupling the output to the interface comprises disposing a first end of the thermally conductive member to be in non-bonded surface contact with the output and soldering a second end of the thermally conductive member to the interface.

In one example the thermally conductive pathway comprises or consists of any of aluminum nitride, silicon carbide, or diamond.

In one example the thermally conductive pathway comprises or consists of an electrically insulative material having a thermal conductivity at room temperature within 35%, or within 30%, or within 25%, or within 20%, or within 15%, or within 10%, or within 5% of the thermal conductivity of copper at room temperature.

In one example the thermally conductive pathway comprises at least one portion of thermally conductive, electrically insulative material.

In one example the thermally conductive pathway further comprises one or more electrically conductive portions, and the step of defining the thermally conductive pathway comprises coupling the portion of thermally conductive, electrically insulative material to the one or more electrically conductive portions such that the interface is electrically isolated from the ground plane.

In one example the portion of thermally conductive, electrically insulative material comprises or consists of any of aluminum nitride, silicon carbide, or diamond.

In one example the portion of thermally conductive, electrically insulative material has a thermal conductivity at room temperature within 35%, or within 30%, or within 25%, or within 20%, or within 15%, or within 10%, or within 5% of the thermal conductivity of copper at room temperature.

In one example the one or more electrically conductive portions are formed of copper.

In one example the one or more electrically conductive portions comprise one or more electrically conductive tracks coupled to one or more vias.

In one example the step of defining the thermally conductive pathway comprises encapsulating the portion of thermally conductive, electrically insulative material within the substrate.

In one example the step of defining the thermally conductive pathway comprises positioning the portion of thermally conductive, electrically insulative material against the ground plane.

In one example an exposed region of the portion of thermally conductive, electrically insulative material defines the interface.

In one example the method further comprises providing a metallic layer on an exposed region of the portion of thermally conductive, electrically insulative material, the metallic layer defining the interface.

In one example the metallic layer is configured for soldering thereto.

In one example thermally coupling the output to the interface comprises soldering the thermally conductive member to the metallic layer.

In one example the at least one non-groundable thermal output comprises first and second non-groundable thermal outputs.

In one example the at least one electronic component comprises first and second electronic components, the first electronic component including the first non-groundable thermal output and the second electronic component including the second non-groundable thermal output.

In one example the step of defining at least one thermally conductive pathway comprises defining a first thermally conductive pathway extending between a first interface exposed on the substrate and the ground plane, and defining a second thermally conductive pathway extending between a second interface exposed on the substrate and the ground plane.

In one example the first thermally conductive pathway is defined to electrically isolate the first interface from the ground plane, and the second thermally conductive pathway is defined to electrically isolate the second interface from the ground plane.

In one example the mounting step comprises thermally coupling the first output to the first interface with at least one first thermally conductive member, and thermally coupling the second output to the second interface with at least one second thermally conductive member.

In one example the first and second thermally conductive pathways comprise or consist of any of aluminum nitride, silicon carbide, or diamond.

In one example the first and second thermally conductive pathways comprise or consist of an electrically insulative material having a thermal conductivity at room temperature within 35%, or within 30%, or within 25%, or within 20%, or within 15%, or within 10%, or within 5% of the thermal conductivity of copper at room temperature.

In one example the first and second thermally conductive pathways comprise respective first and second portions of thermally conductive, electrically insulative material, the first and second portions arranged to be spatially distinct from each other.

In one example the first and second portions of thermally conductive, electrically insulative material comprise or consist of any of aluminum nitride, silicon carbide, or diamond.

In one example the first and second portions comprise or consist of an electrically insulative material having a thermal conductivity at room temperature within 35%, or within 30%, or within 25%, or within 20%, or within 15%, or within 10%, or within 5% of the thermal conductivity of copper at room temperature.

In one example the first and second thermally conductive pathways comprise a shared portion of thermally conductive, electrically insulative material coupling the first and second thermally conductive pathways to each other.

In one example the shared portion of thermally conductive, electrically insulative material comprises or consists of any of aluminum nitride, silicon carbide, or diamond.

In one example the shared portion comprises or consists of an electrically insulative material having a thermal conductivity at room temperature within 35%, or within 30%, or within 25%, or within 20%, or within 15%, or within 10%, or within 5% of the thermal conductivity of copper at room temperature.

In one example either or both of the first and second thermally conductive members comprise a pillar extending between opposed first and second ends, and mounting the electronic component to the substrate comprising coupling the first end of the pillar to the respective first or second output and coupling the second end of the pillar to the respective first or second interface. In one example the pillar has a uniform cross-section extending from the first end to the second end.

In one example either or both of the first and second thermally conductive members is substantially spherical or oval in shape.

In one example the mounting step comprises thermally coupling the first output to the first interface with a plurality of the first thermally conductive members.

In one example the mounting step comprises thermally coupling the second output to the second interface with a plurality of the second thermally conductive members.

In one example either or both of the first and second thermally conductive members is formed of copper or solder.

In one example the at least one electronic component comprises a cascode power amplifier.

In one example the at least one electronic component is integrated into a die, and mounting the electronic component to the substrate comprises mounting the die to the substrate.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosed aspects and embodiments. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to an electronic package, an electronic device comprising an electronic package, and a method of manufacturing an electronic package. The electronic package may be suitable for coupling to a separate circuit board.

In particular, aspects and embodiments described herein provide for mounting an electronic component having a non-groundable thermal output to a substrate panel to form an electronic package. The electronic package and the method of manufacture thereof provide for wicking heat away from the non-groundable thermal output to the substrate panel to avoid overheating of the electronic component, while avoiding short circuiting the output to ground.

It is to be appreciated that embodiments of the packages, devices and methods discussed herein are not limited in application to the details of construction and the arrangement of components set forth in the following description or illustrated in the accompanying drawings. The packages, devices, and methods are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
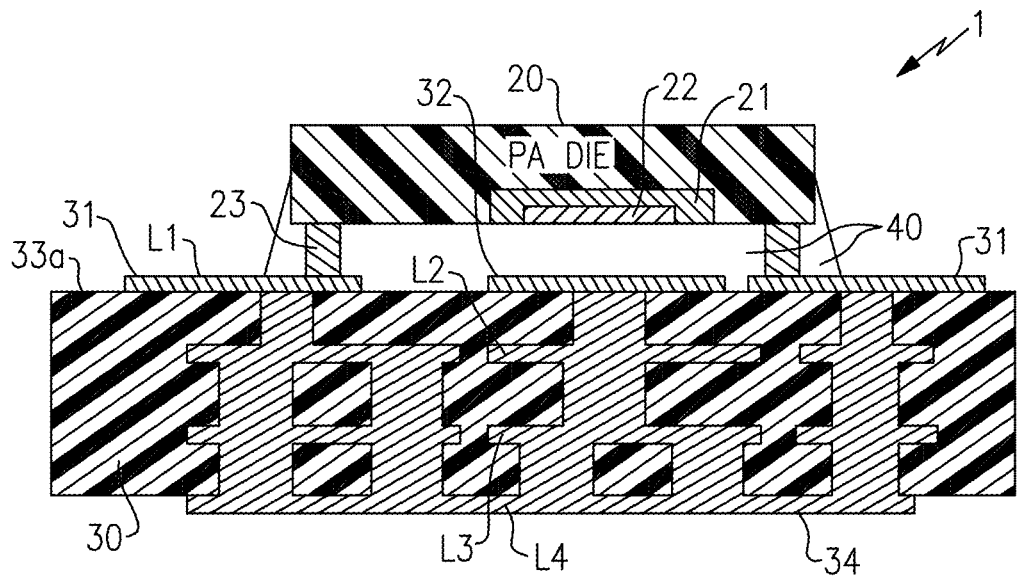
FIG. 1 is a cross-sectional schematic view of an electronic package according to the background art.

FIG. 1 shows a cross-sectional schematic view of an electronic package 1 of the background art. The electronic package 1 has a semiconductor die 20 mounted to a substrate panel 30. The semiconductor die 20 defines an integrated circuit, with an electronic component 21 forming part of the integrated circuit. The electronic component 21 has a non-groundable thermal output 22. Correct operation of the electronic component 21 relies on avoiding the non-groundable output 22 being short circuited to ground.

The substrate panel 30 includes a plurality of electrically conductive pads 31, 32 disposed on a first surface 33a of the substrate panel 30. Each of the electrically conductive pads 31, 32 is electrically coupled to a ground plane 34 via electrically conductive pathways extending through the substrate panel 30.

The semiconductor die 20 is mounted to the first surface 33a of the substrate panel 30 via an annular arrangement of connectors arranged around the perimeter of the lower surface of the die. The connectors 23 are in the form of solder balls, with each of the solder balls 23 soldered to corresponding ones of the electrically conductive pads 31. The space between the die 20 and the first surface 33a of the substrate panel 30 is filled with a mold structure 40 of an epoxy material with the solder balls 23 encapsulated within the mold structure. The epoxy mold structure 40 is thermally insulative, thereby hindering the transfer of heat away from the non-groundable thermal output 22 of the electronic component 21. Hindering the transfer of heat away from the output 22 may necessitate limiting current flow through and/or the duty cycle of the electronic component 21 to avoid overheating of the component.

Figure 2:
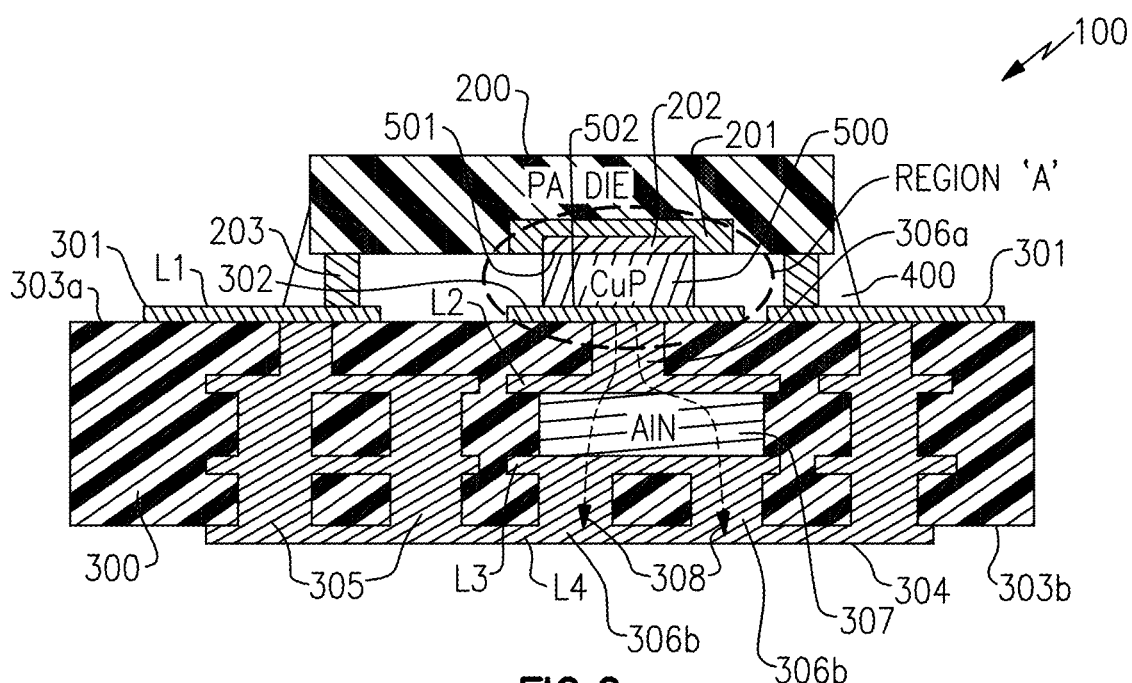
FIG. 2 is a cross-sectional schematic view of a first example of an electronic package according to aspects of the present disclosure.

Electronic Package and Features Thereof:

FIG. 2 shows a cross-sectional schematic view of a first example of an electronic package 100 according to aspects of the present disclosure. The electronic package 100 has a semiconductor die 200 mounted to a substrate panel 300. The semiconductor die 200 defines an integrated circuit, with an electronic component 201 forming part of the integrated circuit. In the illustrated example, the electronic component 201 is a cascode power amplifier having a non-groundable emitter 202. During operation of the cascode power amplifier 201, the emitter 202 increases in temperature. However, correct operation of the cascode power amplifier 201 relies on the emitter 202 not being short circuited to ground. The emitter 202 of the cascode power amplifier 201 therefore corresponds to a "non-groundable thermal output". However, it will be appreciated that the electronic component 201 is not limited to being a cascode power amplifier. Rather, the electronic component 201 may be any electronic component having a thermal output in which correct operation of the component relies on the output not being grounded.

The substrate panel 300 is generally planar in form. The substrate panel 300 may have a laminate construction. The substrate panel 300 may include a ceramic substrate. The ceramic substrate may include a low temperature co-fired ceramic substrate. However, it will be appreciated that other materials may be used to form the substrate panel 300. The substrate panel 300 may define a printed circuit board.

The substrate panel 300 includes a plurality of electrically conductive pads 301, 302 disposed on a first surface 303a of the substrate panel 300. A ground plane 304 is defined on a second surface 303b of the substrate panel 300. The electrically conductive pads 301 are each electrically coupled to the ground plane 304 via electrically conductive pathways 305 extending through the substrate panel 300. The electrically conductive pathways 305 are defined by a combination of electrically conductive tracks L1-L4 and vias embedded within the substrate panel 300. The electrically conductive pads 301, 302, the electrically conductive pathways 305 and the ground plane 304 may be formed of copper, with copper being thermally and electrically conductive. At an ambient room temperature of 20° C., copper has a thermal conductivity of about 401 W/m° C. and an electrical conductivity of about $59.6 \times 10^6$ Siemens per meter (S/m). However, it will be appreciated that other electrically and/or thermally conductive materials may be used for any of the electrically conductive pads 301, 302, the electrically conductive pathways 305, and/or the ground plane 304. It will also be appreciated that in other embodiments the ground plane 304 may be wholly embedded within the substrate panel 300.

The semiconductor die 200 is mounted to the first surface 303a of the substrate panel 300 via an annular array of connectors 203 provided around the perimeter of the lower surface of the die. The connectors 203 are arranged to directly couple the die 200 to corresponding ones of the electrically conductive pads 301. The array of connectors 203 may provide an electrical and thermal coupling between the die 200 and the substrate panel 300. The connectors 203 are in the form of solder balls. It will also be appreciated that in other embodiments, an annular array of metal pillars may be used instead of solder balls. By way of example, such metal pillars may be formed of copper or other conductive metal/metal alloy, with opposed ends of the pillars soldered to the die 200 and the substrate panel 300, respectively. It will also be appreciated that the connectors 203 may be any suitable form of surface-mount technology (SMT) suitable for mounting the die 200 to the substrate panel 300.

A thermally conductive member 500 is provided to directly couple the emitter 202 of the cascode power amplifier 201 to the electrically conductive pad 302. The thermally conductive member 500 illustrated in FIG. 2 has the form of a cylindrical pillar of copper having a substantially uniform cross-section between opposed first and second ends 501, 502 of the pillar, with the opposed ends directly coupled to the non-groundable emitter 202 and the electrically conductive pad 302, respectively. It will be appreciated that the thermally conductive member 500 may have a cross-sectional profile which is other than cylindrical and/or which may vary between the opposed ends. For example, the thermally conductive member 500 may be spheroidal or oval in shape. It will also be appreciated that thermally conductive materials other than copper may be used for the thermally conductive member 500; for example, balls of solder may be used in place of copper. Thermally conductive metals/metal alloys other than copper may be employed for the thermally conductive member 500.

A mold structure 400 fills the space defined between the underside of the die 200 and the first surface 303a of the substrate panel 300. The mold structure 400 may be formed from an epoxy material. However, it will be appreciated that in other embodiments, alternative materials may be used to form the mold structure 400. The thermally conductive member 500 and array of solder balls 203 are substantially encapsulated within the mold structure 400.

Although the example of FIG. 2 shows only a single thermally conductive member 500 coupling the emitter 202 to the electrically conductive pad 302, it will be appreciated that in other embodiments a plurality of thermally conductive members 500 may be used to couple the emitter 202 to the electrically conductive pad 302.

For the example of FIG. 2, the electrically conductive pad 302 is integrated with a first electrically conductive portion 306a. The first electrically conductive portion 306a extends from the pad 302 into the interior of the substrate panel 300. Second electrically conductive portions 306b are integrated with the ground plane 304 and extend from the ground plane into the interior of the substrate panel 300. A portion 307 of thermally conductive, electrically insulative material is encapsulated within the substrate panel 200. The thermally conductive, electrically insulative material used for the portion 307 may be aluminum nitride, as indicated in FIG. 2. Aluminum nitride has a thermal conductivity of around 321 W/m° C. at room temperature, while also being an electrical insulator. However, in other embodiments, silicon carbide, diamond, or other materials combining properties of being thermally conductive and electrically insulative may be employed for the portion 307. In embodiments where the thermally conductive pillar 500, the electrically conductive pad 302, and the first and second electrically conductive portions 306a, 306b are formed of copper, the use of a thermally conductive, electrically insulative material for the portion 307 having a thermal conductivity close to that of copper may be preferred. In other embodiments, the material used for the thermally conductive, electrically insulative portion 307 may be selected to have a thermal conductivity within 35%, within 30%, within 25%, within 20%, within 15%, within 10%, or within 5% of the thermal conductivity of copper at room temperature.

As shown in FIG. 2, the first electrically conductive portion 306a, the thermally conductive electrically insulative portion 307, and the second electrically conductive portions 306b are successively arranged to define a thermally conductive pathway 308 extending between the electrically conductive pad 302 and the ground plane 304. The portion 307 of thermally conductive, electrically insulative material physically separates and electrically decouples the first and second electrically conductive portions 306a, 306b from each other, while also permitting the conduction of heat, received from the emitter 202 via the thermally conductive pillar 500, along the length of the thermally conductive pathway 308. In this manner, the emitter 202 and the electrically conductive pad 302 are electrically isolated from the ground plane 304, thereby avoiding the emitter being short circuited to ground.

Figure 3A:
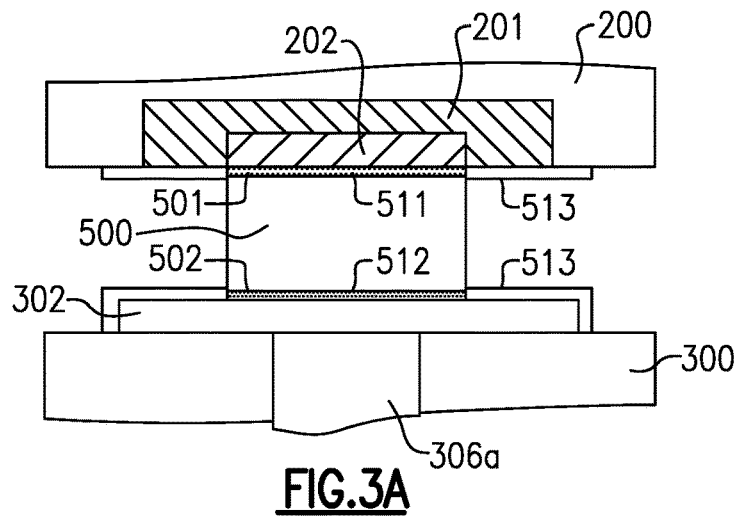
FIGS. 3A to 3C are detail schematic views of region 'A' of the electronic package shown in FIG. 2, illustrating three examples of how a thermally conductive member may be coupled between a non-groundable thermal output of an electronic component and an interface provided on a substrate of the electronic package.
Figure 3B:
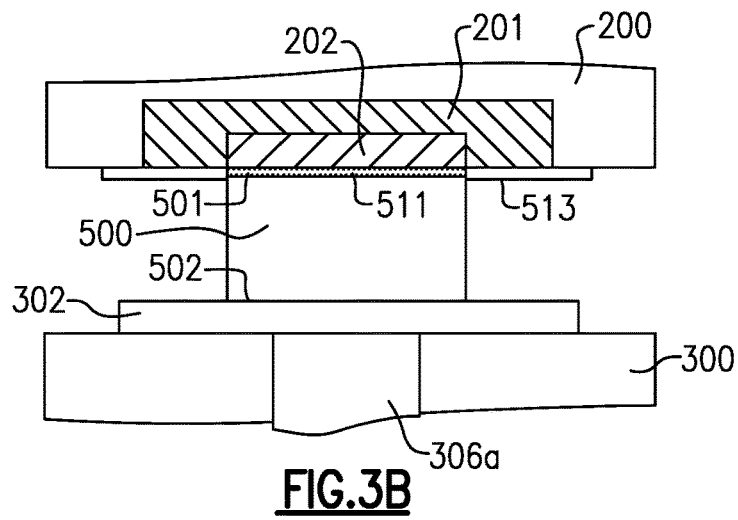

FIGS. 3A to 3B are detail schematic views of region 'A' of the electronic package 100 of FIG. 2, illustrating three examples of how a cylindrical copper pillar defining the thermally conductive member 500 may be coupled between the emitter 202 and the electrically conductive pad 302. For convenience, the mold structure 400 is excluded from these figures.

In the example of FIG. 3A, opposed first and second ends 501, 502 of the cylindrical copper pillar 500 are connected to corresponding surfaces of the die 200 and the electrically conductive pad 302 by respective soldered connections 511, 512. The soldered connections 511, 512 are formed from portions of solder printed onto opposed ends of the pillar 500 and/or corresponding surfaces of the die 200 and the pad 302; heat would be applied to the printed solder to form the soldered connections 511, 512 coupling the pillar 500 to the die 200 and the electrically conductive pad 302, respectively. Solder masks 513 may be provided on the surfaces of the die 200 and pad 302 and generally surround the soldered connections 511, 512. The soldered connections 511, 512 ensure that the opposed ends 501, 502 of the cylindrical copper pillar 500 are retained in surface contact with the emitter 202 and the pad 302, respectively.

In the example of FIG. 3B, the first end 501 of the cylindrical copper pillar 500 is connected to the underside of the die 200 by a soldered connection 511, with the second end 502 of the pillar in non-bonded surface contact with the electrically conductive pad 302. The non-bonded contact is such that the cylindrical copper pillar 500 and the electrically conductive pad 302 are in surface contact with each other, but without being physically bonded to each other. The soldered connection 511 is formed from a portion of solder printed onto the first end 501 of the pillar 500 and/or the corresponding surface of the die 200; heat would be applied to the printed solder to form the soldered connection 511 coupling the first end 501 of the pillar 500 to the die 200. The coupling of the die 200 to the substrate panel 300 by the connectors 203 (as shown in FIG. 2) ensures that the second end 502 of the pillar 500 is retained in surface contact with the electrically conductive pad 302. As for the example of FIG. 3A, the opposed ends 501, 502 of the cylindrical copper pillar 500 are retained in surface contact with the emitter 202 and the electrically conductive pad 302, respectively.

Figure 3C:
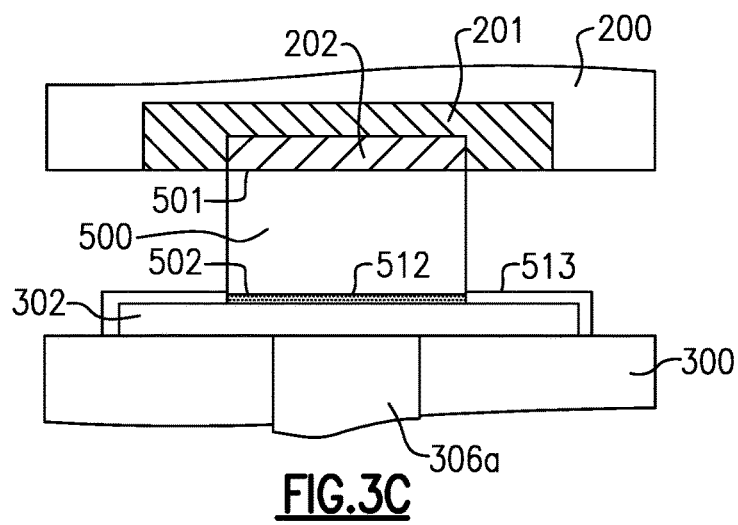

In the example of FIG. 3C, the first end 501 of the cylindrical copper pillar 500 is in non-bonded surface contact with the emitter 202, with the second end 502 of the pillar connected to the electrically conductive pad 302 by a soldered connection 512. The non-bonded contact is such that the cylindrical copper pillar 500 and the die 200 are in surface contact with each other, but without being physically bonded to each other. The soldered connection 512 is formed from a portion of solder printed onto the second end 502 of the pillar 500 and/or the corresponding surface of the electrically conductive pad 302; heat would be applied to the printed solder to form the soldered connection 512 coupling the second end 502 of the pillar 500 to the electrically conductive pad 302. The coupling of the die 200 to the substrate panel 300 by the connectors 203 (as shown in FIG. 2) ensures that the first end 501 of the pillar 500 is retained in surface contact with the emitter 202. As in the example of FIG. 3A, the opposed ends 501, 502 of the cylindrical copper pillar 500 are retained in surface contact with the emitter 202 and the electrically conductive pad 302, respectively.

In a variation to the examples of FIGS. 3A-C and as indicated in preceding paragraphs of this disclosure, the thermally conductive member 500 may have a cross-section other than a cylindrical pillar and/or may be formed from thermally conductive materials other than copper. By way of example, the thermally conductive member 500 may instead be provided as a solder ball, with the solder ball defining a soldered connection between corresponding surfaces of the die 200 and the electrically conductive pad 302.

With reference to FIG. 2, the connectors 203 and the thermally conductive member 500 may be coupled to the semiconductor die 200 before the die is mounted to the substrate panel 300. For example, the connectors 203 and the thermally conductive member 500 may first be coupled to the die 200 by a soldering operation. The die 200 may then be located over the first surface 303a of the substrate panel 300 such that the connectors 203 and the thermally conductive member 500 are positioned against corresponding electrically conductive pads 301, 302. A soldering operation may then be performed to couple the connectors 203 and the thermally conductive member 500 to the pads 301, 302. An epoxy material may then be injected into the space between the underside of the die 200 and the first surface 303a of the substrate panel 300 to fill the space and form mold structure 400 (see FIG. 2). The mold structure 400 substantially encapsulates the thermally conductive member 500 and the connectors 203. As noted above, it will be appreciated that in other embodiments, alternative materials may be used to form the mold structure 400.

When the semiconductor die 200 of the electronic package 100 is provided with electrical power, the cascode power amplifier 201 is activated. Operation of the cascode power amplifier 201 will result in heating of the emitter 202. Heat from the emitter 202 is conducted, via the thermally conductive member 500, to the electrically conductive pad 302. This heat is then conducted along the thermally conductive pathway 308 to the ground plane 304. The thermal conductive properties of the portion 307 of aluminum nitride (or other suitable thermally conductive, electrically insulative material) facilitates the conduction of heat between the electrically conductive pad 302 and the ground plane 304. The electrically insulative properties of the portion 307 of aluminum nitride (or other suitable thermally conductive, electrically insulative material) facilitates electrically isolating the emitter 202 and the electrically conductive pad 302 from the ground plane 304, thereby avoiding the emitter being short circuited to ground.

Figure 4:
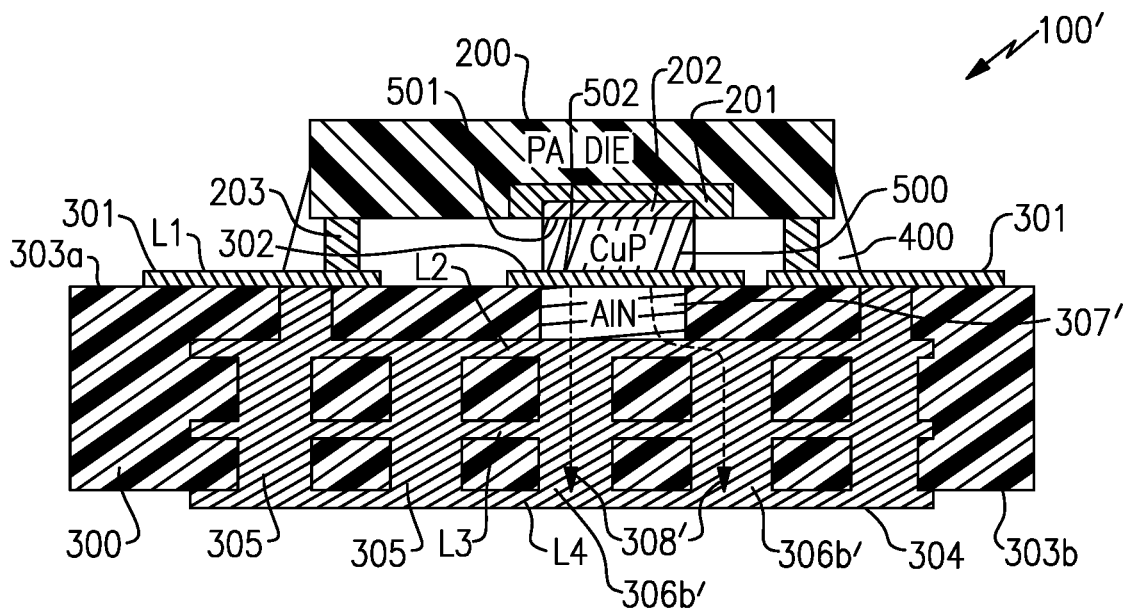
FIG. 4 is a cross-sectional schematic view of a second example of an electronic package according to aspects of the present disclosure.

FIG. 4 shows a cross-sectional schematic view of a second example of an electronic package 100' according to aspects of the present disclosure. Features of the electronic package 100' in common with the electronic package 100 of FIG. 2 are referred to by like reference signs. The electronic package 100' of FIG. 4 differs from the electronic package 100 of FIG. 2 in that the portion 307' of aluminum nitride (or other suitable thermally conductive, electrically insulative material) is positioned against the electrically conductive pad 302. So, for the electronic package 100' of FIG. 4, the thermally conductive pathway 308' extending between the electrically conductive pad 302 and the ground plane 304 is formed by the successive arrangement of the portion 307' of aluminum nitride and the electrically conductive portions 306b'. As shown in FIG. 4, the electrically conductive portions 306b' couple with the electrically conductive pathways 305 extending between the electrically conductive pads 301 and the ground plane 304. The location of the portion 307' of aluminum nitride (or other suitable thermally conductive, electrically insulative material) is such that the emitter 202 and the electrically conductive pad 302 remain electrically isolated from the electrically conductive pathways 305 and the ground plane 304.

In a variation to the example of FIG. 4, an exposed region of the portion 307' of aluminum nitride may be covered with a metallic layer, with the metallic layer replacing the electrically conductive pad 302. This metallic layer may be configured for soldering thereto, thereby enabling the thermally conductive member 500 to be soldered to the metallic layer.

Figure 5:
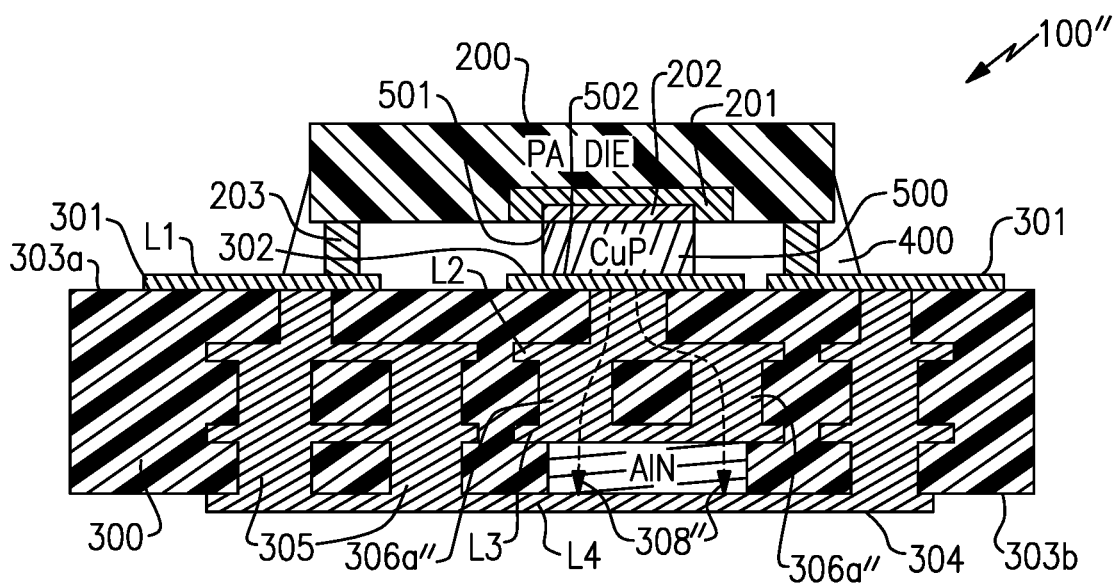
FIG. 5 is a cross-sectional schematic view of a third example of an electronic package according to aspects of the present disclosure.

FIG. 5 shows a cross-sectional schematic view of a third example of an electronic package 100" according to aspects of the present disclosure. Features of the electronic package 100" in common with the electronic package 100 of FIG. 2 are referred to by like reference signs. The electronic package 100" of FIG. 5 differs from the electronic package 100 of FIG. 2 in that the portion of aluminum nitride (or other suitable thermally conductive, electrically insulative material) is positioned against the ground plane 304. So, for the electronic package 100" of FIG. 5, the thermally conductive pathway 308" extending between the electrically conductive pad 302 and the ground plane 304 is formed by the successive arrangement of the electrically conductive portions 306a" and the portion of aluminum nitride (or other suitable thermally conductive, electrically insulative material). The location of the portion of aluminum nitride is such that the emitter 202 and the electrically conductive pad 302 remain electrically isolated from the ground plane 304.

Figure 6:
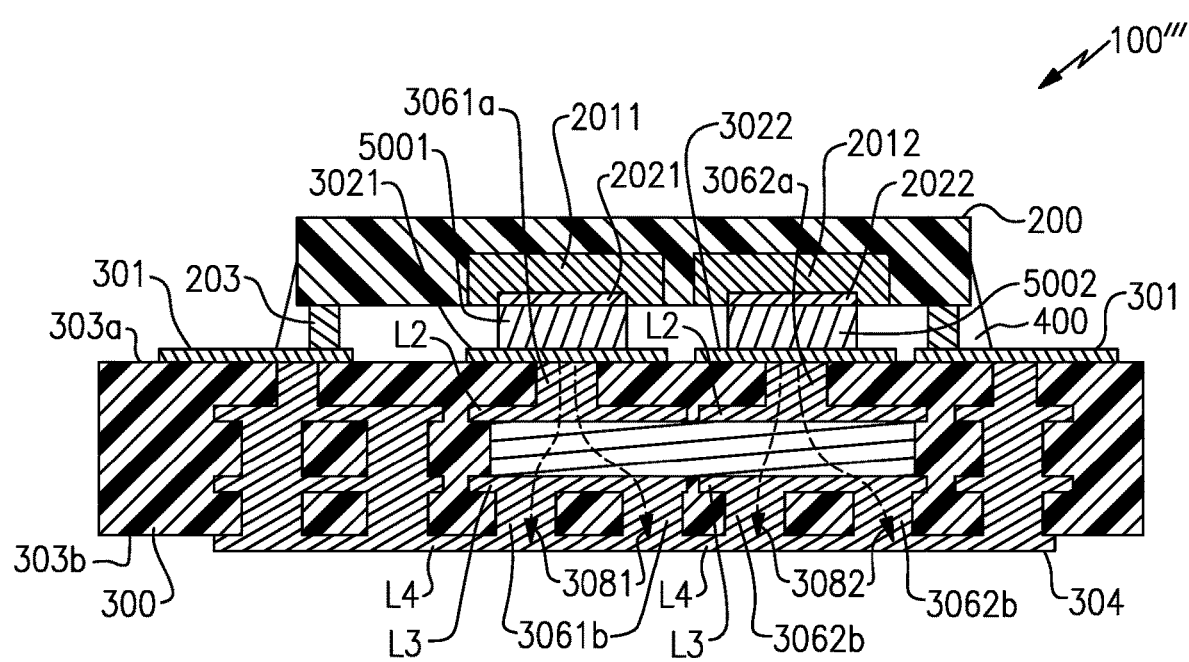
FIG. 6 is a cross-sectional schematic view of a fourth example of an electronic package according to aspects of the present disclosure.

FIG. 6 shows a cross-sectional schematic view of a fourth example of an electronic package 100''' according to aspects of the present disclosure. Features of the electronic package 100''' in common with the electronic package 100 of FIG. 2 are referred to by like reference signs. The electronic package 100''' of FIG. 6 differs from the electronic packages 100, 100', 100" of FIGS. 2, 4 & 5 in that the semiconductor die 200 includes first and second non-groundable thermal outputs 2021, 2022. The first and second non-groundable thermal outputs 2021, 2022 form part of respective first and second electronic components 2011, 2012. Each of the electronic components 2011, 2012 may be in the form of a cascode power amplifier, with the outputs 2021, 2022 being respective emitters of the cascode power amplifiers. However, as previously discussed, it will be appreciated that the electronic components 2011, 2012 are not limited to being cascode power amplifiers. Rather, the electronic components 2011, 2012 may each be any electronic component having a thermal output in which correct operation of the component relies on the output not being grounded. It will also be appreciated that in other embodiments the non-groundable thermal outputs 2021, 2022 may form part of the same electronic component, rather than being associated with separate electronic components 2011, 2012.

First and second thermally conductive members 5001, 5002 directly couple the respective first and second non-groundable thermal outputs 2021, 2022 to respective electrically conductive pads 3021, 3022. In common with the example of FIG. 2, the thermally conductive members 5001, 5002 illustrated in FIG. 6 have the form of a cylindrical pillar of copper having a substantially uniform cross-section between opposed first ends and second ends. The opposed ends of each pillar are directly coupled to the corresponding output 2021, 2022 and electrically conductive pad 3021, 3022. Again, it will be appreciated that the thermally conductive members 5001, 5002 may have a cross-sectional profile which is other than cylindrical and/or which may vary between the opposed ends; for example, the thermally conductive members 5001, 5002 may be spheroidal or oval in shape. It will also be appreciated that thermally conductive materials other than copper may be used for the thermally conductive members 5001, 5002; for example, balls of solder may be used in place of copper. Thermally conductive metals/metal alloys other than copper may be employed for the thermally conductive member 500.

The first and second electrically conductive pads 3021, 3022 are integrated with respective electrically conductive portions 3061a, 3062a. The electrically conductive portions 3061a, 3062a extend from their corresponding pads 3021, 3022 into the interior of the substrate panel 300. The electrically conductive portions 3061b, 3062b are integrated with the ground plane 304 and extend from the ground plane into the interior of the substrate panel 300. A single portion of thermally conductive, electrically insulative material is encapsulated within the substrate panel 300. A first thermally conductive pathway 3081 is defined between the electrically conductive pad 3021 and the ground plane 304 by the successive arrangement of the electrically conductive portion 3061a, the thermally conductive electrically insulative portion, and the electrically conductive portions 3061b. Similarly, a second thermally conductive pathway 3082 is defined between the electrically conductive pad 3022 and the ground plane 304 by the successive arrangement of the electrically conductive portion 3062a, the thermally conductive electrically insulative portion, and the electrically conductive portions 3062b. The thermally conductive electrically insulative portion is included in both the first and second thermally conductive pathways 3081, 3082. The thermally conductive electrically insulative portion thermally couples the first and second thermally conductive pathways 3081, 3082 to each other. The thermally conductive electrically insulative portion provides for conduction of heat received from outputs 2021, 2022 via the thermally conductive members 5001, 5002 and the pads 3021, 3022, while ensuring that the outputs 2021, 2022 and the respective electrically conductive pads 3021, 3022 remain electrically isolated from the ground plane 304. It is therefore seen that heat may be conducted away from the non-groundable thermal outputs 2021, 2022 into the substrate panel 300, while avoiding short circuiting the outputs to ground. As discussed above for the examples of FIGS. 2, 4 & 5, the thermally conductive, electrically insulative material used for the thermally conductive electrically insulative portion may be aluminum nitride. However, in other embodiments, silicon carbide, diamond, or other materials combining properties of being thermally conductive and electrically insulative may be employed for the thermally conductive electrically insulative portion. In embodiments where the thermally conductive pillars 5001, 5002, the electrically conductive pads 3021, 3022, and the first and second electrically conductive portions 3061*a/b*, 3062*a/b* are formed of copper, the use of a thermally conductive, electrically insulative material for the thermally conductive electrically insulative portion having a thermal conductivity close to that of copper may be preferred. In other embodiments, the material used for the thermally conductive, electrically insulative portion may be selected to have a thermal conductivity within 35%, within 30%, within 25%, within 20%, within 15%, within 10%, or within 5% of the thermal conductivity of copper at room temperature.

Although FIG. 6 shows a portion of thermally conductive, electrically insulative material coupling the first and second thermally conductive pathways 3081, 3082 to each other, in other embodiments the first and second thermally conductive pathways may be distinct from each other, with each pathway having distinct portions of thermally conductive, electrically insulative material instead of a shared portion.

Although FIGS. 2, & 4 to 6 illustrate exemplary electronic packages in which electronic components are mounted to a single side of the packaging substrate 300, in other embodiments the electronic package may instead be a double-sided electronic package.

It will also be appreciated that in other embodiments the semiconductor die 200 may be mounted to the substrate panel 300 by any suitable form of surface-mount technology (SMT); for example and without limitation, wire bonding.

It will also be appreciated that in other embodiments the electronic components 201, 2011, 2012 may be SMT components directly mounted to the substrate panel 300 by SMT, without being integrated into or forming part of a semiconductor die.

Figure 7:
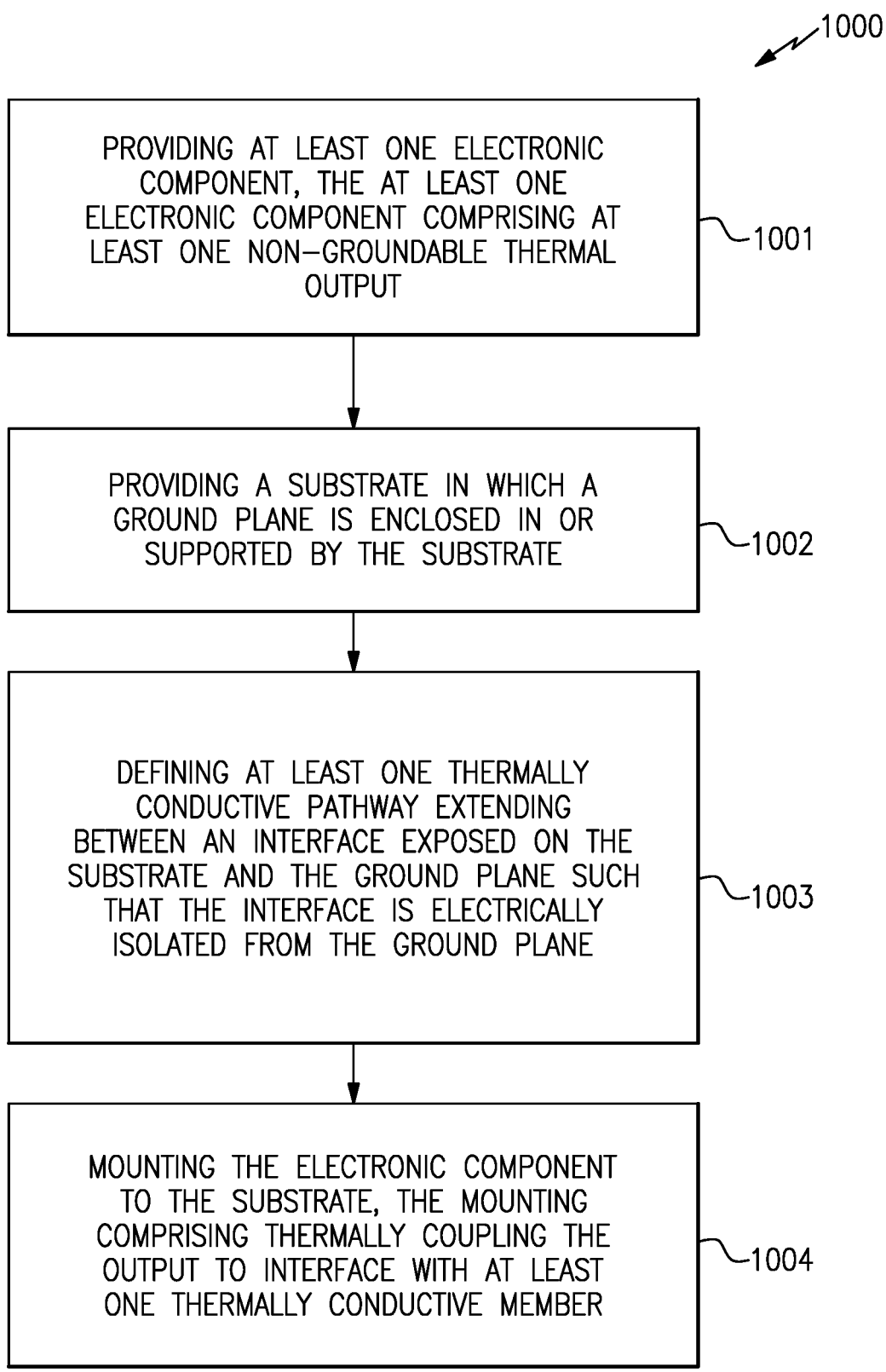
FIG. 7 illustrates steps of a first example of a method for manufacturing an electronic package according to aspects of the present disclosure.

Method of Manufacture of Electronic Package:

FIG. 7 illustrates various exemplary steps in a method 1000 for manufacturing an electronic package, such as the electronic packages 100, 100', 100", or 100''' described above. The method 1000 is applicable to the fabrication of the electronic packages 100, 100', 100" and 100''' of FIGS. 2, 4, 5 & 6, but is not limited thereto. For convenience, the method 1000 is described with reference to the features of the electronic package 100 of FIG. 2.

In a first step 1001, an electronic component 201 is provided, in which the electronic component has at least one non-groundable thermal output 202. As described above, the electronic component 201 may take the form of a cascode power amplifier having a non-groundable emitter 202. However, as indicated above, it will be appreciated that the electronic component 201 is not limited to being a cascode power amplifier. Rather, the electronic component 201 may be any electronic component having a thermal output 202 in which correct operation of the component relies on the output not being grounded. As described in relation to FIG. 2, the electronic component 201 forms part of an integrated circuit of a semiconductor die 200. However, as indicated above, it will also be appreciated that in other embodiments the electronic component 201 may be directly mountable to the substrate panel 300 by SMT, without being integrated into or forming part of a semiconductor die.

In a second step 1002, a substrate is provided in which a ground plane 304 is enclosed in or supported by the substrate. As described in relation to FIG. 2, the substrate may be in the form of substrate panel 300.

In a third step 1003, a thermally conductive pathway is defined to extend between an interface exposed on the substrate and the ground plane, such that the interface is electrically isolated from the ground plane. As described in relation to FIG. 2, the thermally conductive pathway may be in the form of thermally conductive pathway 308. The thermally conductive pathway 308 may extend between an interface (such as electrically conductive pad 302) and the ground plane 304. The use of a portion 307 of aluminum nitride (or other suitable thermally conductive, electrically insulative material) to form all or part of the thermally conductive pathway 308 facilitates electrically isolating the electrically conductive pad 302 from the ground plane 304, while enabling the conduction of heat along the pathway 308.

In a fourth step 1004, the electronic component 201 is mounted to the substrate. The mounting step 1004 comprises thermally coupling the non-groundable thermal output 202 to the interface with at least one thermally conductive member. As described above, the interface may be in the form of electrically conductive pad 302, and the thermally conductive member may be in the form of the thermally conductive member 500 described above. The thermally conductive member 500 may be coupled between the output 202 and the electrically conductive pad 302. As described in preceding paragraphs and illustrated in the figures, the thermally conductive member 500 may have the form of a cylindrical pillar of copper having a substantially uniform cross-section between opposed first and second ends 501, 502 of the pillar (see FIG. 2). It will also be appreciated that the thermally conductive member 500 may have a cross-sectional profile which is other than cylindrical and/or which may vary between the opposed ends. For example, the thermally conductive member 500 may be spheroidal or oval in shape. It will also be appreciated that thermally conductive materials other than copper may be used for the thermally conductive member 500; for example, balls of solder may be used in place of copper. Thermally conductive metals/metal alloys other than copper may be employed for the thermally conductive member 500. Various non-limiting examples of coupling the thermally conductive member 500 to the output 202 and electrically conductive pad 302 are shown in FIGS. 3A to 3C and described above.

The electronic package resulting from the method 1000 may correspond to the electronic packages 100, 100', 100", or 100''' of FIGS. 2, 4, 5 & 6, but is not limited thereto. As noted above, it will be appreciated that the above discussion of the technical features, materials and other characteristics of the different features of the electronic packages 100, 100', 100", or 100''' of FIGS. 2, 4, 5 & 6 is applicable to the method 1000 of manufacture outlined in FIG. 7.

Exemplary Devices Incorporating Electronic Package:

The electronic package as described in the present disclosure may be included in an electronic device, such as a wireless device. By way of example and without limitation, such a wireless device can include, for example, a cellular phone, a smart-phone, a hand-held wireless device with or without phone functionality, a wireless tablet, a wireless router, a wireless access point, a wireless base station, etc. However, it will be appreciated that the electronic package of the present disclosure is not limited to incorporation in wireless devices.

Figure 8:
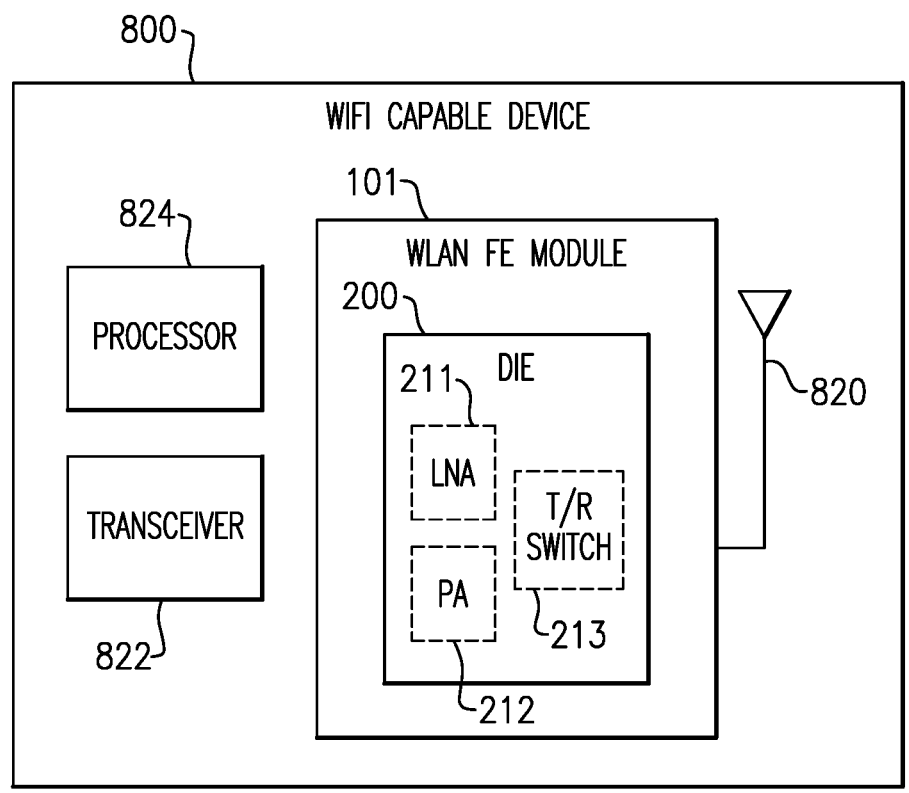
FIG. 8 illustrates an electronic package implemented in a wireless device according to aspects of the present disclosure.

FIG. 8 illustrates an exemplary implementation of an electronic package 101 of the present disclosure in a WLAN capable device 800. The electronic package 101 is in the form of a WLAN FE module on which is mounted various semiconductor dies, such as die 200. The die 200 can include a low noise amplifier (LNA) 211, power amplifier (PA) 212 and transmit/receive (T/R) switch 213. The LNA 211 is implemented in a cascode configuration. In the example of FIG. 8, the wireless device 800 can also include a transceiver 822 for generating an RF signal to be amplified by the PA 212 and transmitted through an antenna 820, and for processing a received RF signal received through the antenna 820 and amplified by the LNA 211. The wireless device 800 can also include a processor 824 configured to provide various control functionalities.

It will be noted that the figures are for illustrative purposes only and are not to scale. Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the aspects and embodiments disclosed herein. Accordingly, the foregoing description and drawings are by way of example only, and the scope of the aspects and embodiments disclosed herein should be determined from proper construction of the appended claims, and their equivalents.

What is claimed is:

1. A method for manufacturing an electronic package, the method comprising:
providing at least one electronic component, the at least one electronic component including at least one non-groundable thermal output;
providing a substrate in which a ground plane is enclosed in or supported by the substrate;
defining at least one thermally conductive pathway extending between an interface exposed on the substrate and the ground plane such that the interface is electrically isolated from the ground plane; and
mounting the electronic component to the substrate, the mounting including thermally coupling the output to the interface with at least one thermally conductive member.

2. The method of claim 1 wherein the thermally conductive member comprises a pillar extending between opposed first and second ends, and mounting the electronic component to the substrate includes coupling the first end of the pillar to the output and coupling the second end of the pillar to the interface.

3. The method of claim 1 wherein mounting the electronic component to the substrate includes thermally coupling the output to the interface with a plurality of the thermally conductive members.

4. The method of claim 1 wherein thermally coupling the output to the interface comprises soldering the thermally conductive member to the interface.

5. The method of claim 1 wherein the thermally conductive member comprises a solder ball, and thermally coupling the output to the interface comprises heating the solder ball to define a soldered connection between the output and the interface.

6. The method of claim 1 wherein thermally coupling the output to the interface comprises soldering a first end of the thermally conductive member to the electronic component and soldering a second end of the thermally conductive member to the interface.

7. The method of claim 1 wherein thermally coupling the output to the interface comprises soldering a first end of the thermally conductive member to the electronic component and disposing a second end of the thermally conductive member to be in non-bonded surface contact with the interface.

8. The method of claim 1 wherein thermally coupling the output to the interface comprises disposing a first end of the thermally conductive member to be in non-bonded surface contact with the output and soldering a second end of the thermally conductive member to the interface.

9. The method of claim 1 wherein the thermally conductive pathway comprises or consists of an electrically insulative material having a thermal conductivity at room temperature within one of 35%, 30%, 25%, 20%, 15%, 10%, or 5% of the thermal conductivity of copper at room temperature.

10. The method of claim 1 wherein the thermally conductive pathway comprises at least one portion of thermally conductive, electrically insulative material.

11. The method of claim 10 wherein the thermally conductive pathway further comprises one or more electrically conductive portions, and defining the thermally conductive pathway comprises coupling the portion of thermally conductive, electrically insulative material to the one or more electrically conductive portions such that the interface is electrically isolated from the ground plane.

12. The method of claim 11 wherein defining the thermally conductive pathway comprises encapsulating the portion of thermally conductive, electrically insulative material within the substrate.

13. The method of claim 12 wherein defining the thermally conductive pathway comprises positioning the portion of thermally conductive, electrically insulative material against the ground plane.

14. The method of claim 12 wherein an exposed region of the portion of thermally conductive, electrically insulative material defines the interface.

15. The method of claim 12 further comprising providing a metallic layer on an exposed region of the portion of thermally conductive, electrically insulative material, the metallic layer defining the interface.

16. The method of claim 1 wherein defining the at least one thermally conductive pathway comprises defining a first thermally conductive pathway extending between a first interface exposed on the substrate and the ground plane, and defining a second thermally conductive pathway extending between a second interface exposed on the substrate and the ground plane.

17. The method of claim 16 wherein mounting the electronic component to the substrate comprises thermally coupling the output to the first interface with at least one first thermally conductive member, and thermally coupling a second output to the second interface with at least one second thermally conductive member.

18. The method of claim 16 wherein the first and second thermally conductive pathways comprise a common portion of thermally conductive, electrically insulative material coupling the first and second thermally conductive pathways to each other.

19. The method of claim 1 wherein the at least one electronic component is integrated into a die, and mounting the electronic component to the substrate comprises mounting the die to the substrate.

* * * * *